US012571815B2

(12) United States Patent
Hwang et al.

(10) Patent No.: US 12,571,815 B2
(45) Date of Patent: Mar. 10, 2026

(54) CONTACT PIN AND SPRING CONTACT INCLUDING THE SAME

(71) Applicants:HICON CO., LTD., Seongnam-si (KR); Dong Weon Hwang, Seongnam-si (KR); Jae Baek Hwang, Seongnam-si (KR)

(72) Inventors: Dong Weon Hwang, Seongnam-si (KR); Jae Baek Hwang, Seongnam-si (KR)

(73) Assignees: HICON CO., LTD., Seongnam-si (KR); Dong Weon Hwang, Seongnam-si (KR); Jae Baek Hwang, Seongnam-si (KR)

( * ) Notice: Subject to any disclaimer, the term of this patent is extended or adjusted under 35 U.S.C. 154(b) by 225 days.

(21) Appl. No.: 18/240,664

(22) Filed: Aug. 31, 2023

(65) Prior Publication Data

US 2024/0280608 A1 Aug. 22, 2024

(30) Foreign Application Priority Data

Feb. 16, 2023 (KR) ........................ 10-2023-0020976

(51) Int. Cl.
*G01R 1/04* (2006.01)
(52) U.S. Cl.
CPC .................................. *G01R 1/0466* (2013.01)
(58) Field of Classification Search
CPC .................................................. G01R 1/0466
See application file for complete search history.

(56) References Cited

U.S. PATENT DOCUMENTS

| | | | |
|---|---|---|---|
| 8,715,015 B2 | 5/2014 | Hwang | |
| 2006/0073710 A1* | 4/2006 | Hwang | ................ H01R 12/714 439/66 |
| 2009/0075529 A1* | 3/2009 | Johnston | ............ H01R 13/2421 439/824 |
| 2010/0035483 A1 | 2/2010 | Hsieh et al. | |

(Continued)

FOREIGN PATENT DOCUMENTS

| | | |
|---|---|---|
| CN | 106415278 A | 2/2017 |
| JP | 2008-516398 A | 5/2008 |

(Continued)

OTHER PUBLICATIONS

Translation of KR 101953104 B1 (Year: 2019).*

(Continued)

*Primary Examiner* — Paresh Patel
(74) *Attorney, Agent, or Firm* — NKL Law; Jae Youn Kim

(57) ABSTRACT

Provided are a contact pin, for a spring contact, the strength of which is guaranteed when a spring contact is manufactured in various lengths and which contributes to saving costs and time required to manufacture a test socket, and a spring contact including the same. The contact pin includes a body part of a certain width and thickness, a contact part provided on one end of the body part to be in contact with an object to be inspected, a shoulder part protruding in a width direction of the body part, a leg part extending in a longitudinal direction of the body part to face the contact part, and a guide part formed in the longitudinal direction of the body part to guide a vertical movement of another contact pin when coupled to the other contact pin.

12 Claims, 15 Drawing Sheets

(56) References Cited

U.S. PATENT DOCUMENTS

| | | | | |
|---|---|---|---|---|
| 2012/0202390 A1* | 8/2012 | Park | H01R 12/714 | |
| | | | 439/700 | |
| 2013/0012076 A1* | 1/2013 | Hwang | H01R 13/2421 | |
| | | | 439/824 | |
| 2021/0102973 A1* | 4/2021 | Hwang | G01R 1/06722 | |
| 2022/0206041 A1* | 6/2022 | Hwang | G01R 31/2886 | |

FOREIGN PATENT DOCUMENTS

| | | |
|---|---|---|
| JP | 2010-539672 A | 12/2010 |
| JP | 2013-511039 A | 3/2013 |
| JP | 2019-178999 A | 10/2019 |
| JP | 2022-530559 A | 6/2022 |
| JP | 2022-141762 A | 9/2022 |
| KR | 10-2011-0040625 A | 4/2011 |
| KR | 10-2011-0051668 A | 5/2011 |
| KR | 10-2011-0130138 A | 12/2011 |
| KR | 10-1457168 B1 | 11/2014 |
| KR | 10-2018-0111221 A | 10/2018 |
| KR | 10-2080832 B | 2/2020 |
| KR | 10-2020-0063675 A | 6/2020 |
| KR | 10-2270275 B1 | 6/2021 |
| KR | 10-2559623 B1 | 9/2023 |
| TW | 202227822 A | 7/2022 |

OTHER PUBLICATIONS

Office Action dated Aug. 6, 2024, issued in counterpart Japanese Application No. 2023-147824 with English machine translation. (26 pages).

Office Action dated Oct. 25, 2024, issued in counterpart Korean Application No. 10-2023-0094788 with English machine translation. (19 pages).

International Search Report, Notification of Transmittal of the International Search Report and the Written Opinion of the International Search Authority, or the Declaration, and Written Opinion of the International Searching Authority dated Dec. 14, 2023, issued in counterpart International Application No. PCT/KR2023/013749 with English machine translation. (20 pages).

Extended European Search Report dated Jan. 29, 2024, issued in counterpart EP Application No. 23191738.6. (7 pages).

Office Action dated Apr. 15, 2024, issued in counterpart Taiwanese Application No. 11320369560 with English machine translation. (9 pages).

Opinion submission notice dated Mar. 16, 2023 issued in counterpart Korean patent application No. 10-2023-0020976 (12 pages).

Patent decision dated Apr. 19, 2023 issued in counterpart Korean patent application No. 10-2023-0020976 (16 pages).

Prior art search report dated Feb. 24, 2023 issued in counterpart Korean patent application No. 10-2023-0020976 (22 pages).

* cited by examiner

<u>11</u>

CONTACT PIN AND SPRING CONTACT INCLUDING THE SAME

BACKGROUND

1. Field

The present disclosure relates to a contact pin of a spring contact that electrically connects a plurality of terminals (leads) of a semiconductor device (integrated circuit (IC)) to a pad of a printed circuit board (PCB) or electrically connects terminals (leads) of an IC such as a central processing unit (CPU) to a PCB inside an electronic product such as a computer and a mobile phone so as to test the semiconductor device (IC), and a spring contact including the same.

2. Description of Related Art

In general, a ball grid array (BGA) or land grid array (LGA) type semiconductor integrated circuit (IC) is finally subject to feature measurement or defect inspection by an inspection device through various electrical tests. In this case, a test socket is used to electrically connect a circuit pattern of a printed circuit board (PCB) installed for inspection in the inspection device for inspection to a terminal (lead) ball (contact ball) or land of the BGA or LGA type semiconductor IC.

A sufficient pressing force should be applied to a contact used in the test socket for reliable contact with a terminal (lead) of an IC and thus the contact should be given a sufficient elastic contact force within an appropriate range. Various types of contacts have been developed to meet these conditions.

Meanwhile, a plurality of spring contacts are installed in a housing of the test socket according to a certain rule. Recently, as various types of semiconductor devices have been developed, customers' demand for spring contacts of various lengths is increasing but a conventional pogo pin type spring contact is not likely to satisfy customers' demand for performance.

For example, when the conventional pogo pin type spring contact is manufactured to be long to meet a customer's demand, the length of a contact pin of the spring contact should be increased, and at the same time, a depth of a pin hole into which the spring contact is inserted should be processed to a diameter for accommodation of a width of a tip part of the contact pin during the design of a test socket, in consideration of the length of the contact pin.

Because spring contact pins become finer for high-speed data processing and low power consumption, it is difficult to process a long pin hole to have a diameter for accommodation of a width of a tip part of a contact pin, and processing costs may be high and quality is difficult to guarantee even when a long pin hole can be processed to have a relatively small diameter for accommodation of the width of the tip part of the contact pin.

That is, with conventional spring contacts, it is difficult to meet the demand of customers who require spring contacts of various lengths.

On the other hand, there is a rubber type socket of another related art. The rubber type socket includes an elastic insulating body formed by solidifying insulating silicon powder and a conductive silicon part formed to vertically pass through the insulating body so as to correspond to a terminal of a device.

In the rubber type socket, the conductive silicon part is formed in a certain array on the insulating body, when a silicon mixture formed by mixing insulating silicon and conductive powder at a certain ratio is input into a mold and a strong magnetic field is formed at a position at which the conductive silicon part is to be formed, so that the conductive powder of the silicon mixture may be gathered at the position of the magnetic field, thereby solidifying the melted silicon mixture.

The rubber type socket is disadvantageous in that an elastic response rate is lower than that of a pin type contact (spring contact) and elasticity is lost when a test is repeatedly conducted, thus significantly reducing a service life. Therefore, the number of uses is short and costs increase due to frequent replacement. As elastic durability decreases over time, and thus an elastic repulsive force becomes zero or significantly decreases when a compression test is continuously conducted for a long time (more than one week), causing a short circuit. Thus, the rubber type socket is difficult to use for a long-term test.

In addition, the rubber type socket is disadvantageous in that elasticity is greatly affected by temperature and the uniformity of resistance properties of individual conductive silicon parts is low.

SUMMARY

Therefore, the present disclosure is directed to solving the above-described problems.

The present disclosure is to provide a contact pin for improving the quality of a test socket when a spring contact is manufactured in various lengths according to customers' demand for performance, and a spring contact including the same.

The present disclosure is to provide a contact pin having a structure for easily processing a pin hole to have a diameter for accommodation of a width of a tip part of a spring contact pin when a pin hole of a test socket is processed, and a spring contact including the same.

The present disclosure is to provide a contact pin having a structure for reducing processing costs and time when a spring contact pin is manufactured in various lengths according to customers' demand for performance, and a spring contact including the same.

The present disclosure is to provide a contact pin having a structure guaranteeing the strength thereof to improve the quality of a spring contact when a spring contact pin is manufactured in various lengths according to customers' demand for performance, and a spring contact including the same.

In an aspect of the present disclosure, a contact pin for a spring contact includes a body part forming a predetermined width and thickness, a contact part provided on one end of the body part to be in contact with an object to be inspected, a shoulder part protruding in a width direction of the body part, a leg part extending in a longitudinal direction of the body part to face the contact part, and a guide part formed in the longitudinal direction of the body part to guide a vertical movement of another contact pin when coupled to the other contact pin.

The shoulder part may include first shoulders configured to assist an alignment of the contact pin during manufacture of the spring contact, and second shoulders configured to support the elasticity of a spring, the second shoulders being provided at positions spaced a certain distance from the first shoulders to be away from the contact part.

The first shoulders may be provided at positions spaced a certain distance from the contact part in a longitudinal direction of the body part.

The first shoulders may protrude from symmetrical positions on both ends of the body part.

The second shoulders may protrude from symmetrical positions at both ends of the body part, and a width of the second shoulders may be less than an outer diameter of the spring.

A width of the first shoulders may be greater than or equal to that of the second shoulders. Alternatively, the width of the first shoulders may be less than that of the second shoulders.

The contact part may be formed on one end of the body part such that at least one of the width or thickness of the body part decreases.

The leg part may include a pair of symmetric leg parts, and a pair of stopper members protruding from opposite ends of the leg part.

A shortest distance between the pair of stopper members may be less than the thickness of the body part.

The shortest distance between the pair of stopper members may be greater than or equal to a thickness of the guide part.

The guide part may include a stopping groove into which a stopper member of another contact pin is inserted when the spring contact is compressed.

The stopping groove may be formed in one end of the guide part.

The stopper member may include a first surface in surface contact with a step of the stopping groove, and a second surface inclined at a certain slope on one end of the first surface toward an end of the stopper member.

The second surface may be inclined at the slope in a direction in which a width of the stopper member decreases.

In another aspect of the present disclosure, there is provided a spring contact including the contact pin described above as a pair of first and second contact pins, the spring contact including a spring supported by a shoulder part of the first contact pin and a shoulder part of the second contact pin.

A leg part of the first contact pin and a leg part of the second contact pin may cross each other in a vertical direction.

The first contact pin and the second contact pin are the same in length but may be different from each other in length when necessary.

A contact part of the first contact pin and a contact part of the second contact pin may be different from each other in shape. In this case, at least one of the contact part of the first contact pin or the contact part of the second contact pin may form two or more contacts with an object to be inspected.

A cross section of the contact part of at least one of the first contact pin or the second contact pin may be circular as a portion of a body part of the at least one of the first contact pin or the second contact pin is rolled in a width direction. In this case, the contact part is in the form of crown with a plurality of tips formed along the circular cross section of the body part.

The features of each of the above-described embodiments may be implemented in combination with other embodiments unless contradictory or exclusive to other embodiments.

DETAILED DESCRIPTION

Hereinafter, embodiments of the present disclosure will be described in detail with reference to the accompanying drawings. The following detailed descriptions are provided to help a comprehensive understanding of methods, devices and/or systems described herein. However, the embodiments are described by way of examples only and the present disclosure is not limited thereto.

In describing the embodiments of the present disclosure, when a detailed description of well-known technology relating to the present disclosure may unnecessarily make the spirit of the present disclosure unclear, a detailed description thereof will be omitted. Further, the following terminologies are defined in consideration of the functions in the present disclosure and may be construed in different ways by the intention of users and operators. Therefore, the definitions thereof should be construed based on the contents throughout the specification. The terms used in the detailed description is merely for describing the embodiments of the present disclosure and should in no way be limited. Unless clearly used otherwise, an expression in the singular form includes the meaning of the plural form. In this description, expressions such as "including" or "comprising" are intended to indicate certain characteristics, numbers, steps, operations, elements, some or combinations thereof, and it should not be interpreted to exclude the existence or possibility of one or more other characteristics, numbers, steps, operations, elements, parts or combinations thereof other than those described.

In addition, terms 'first', 'second', A, B, (a), (b), and the like, will be used in describing components of embodiments of the present disclosure. These terms are used only in order to distinguish any component from other components, and features, sequences, or the like, of corresponding components are not limited by these terms.

Figure 1:
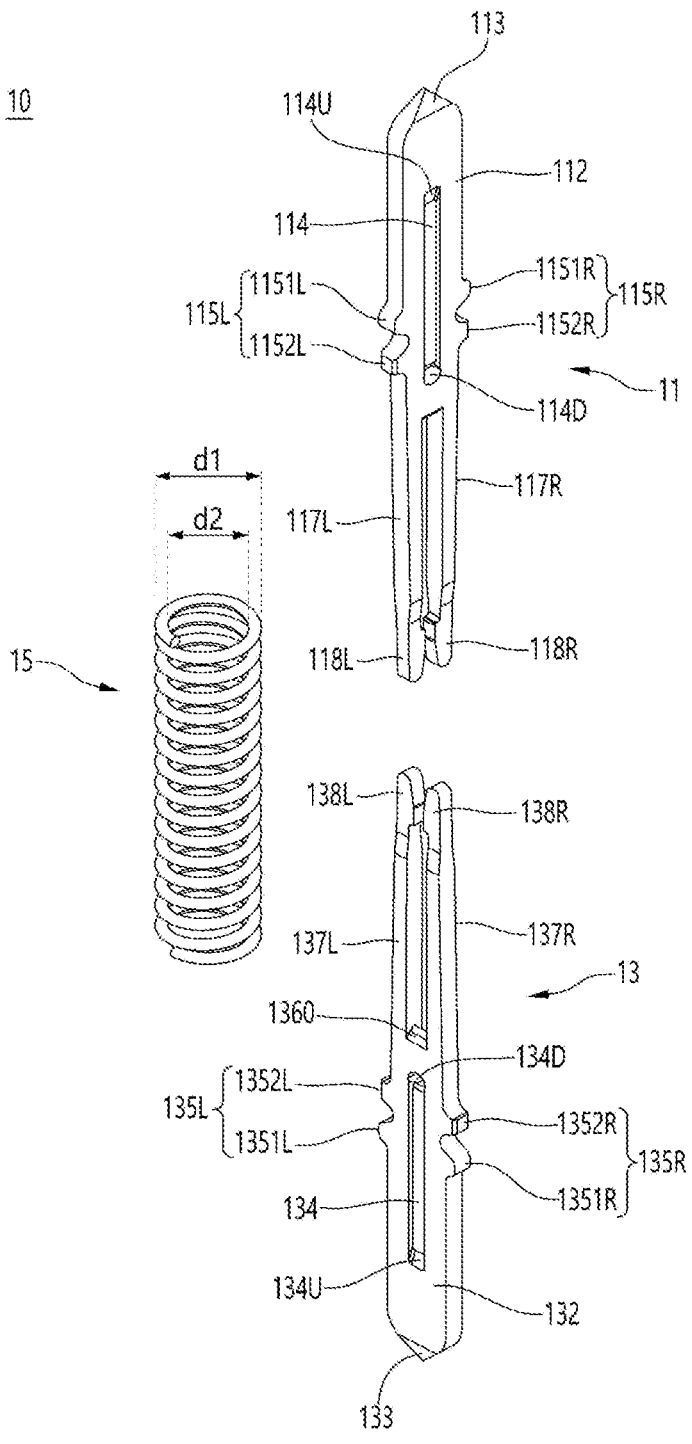
FIG. 1 is an exploded view of a spring contact according to an embodiment of the present disclosure.
Figure 2:
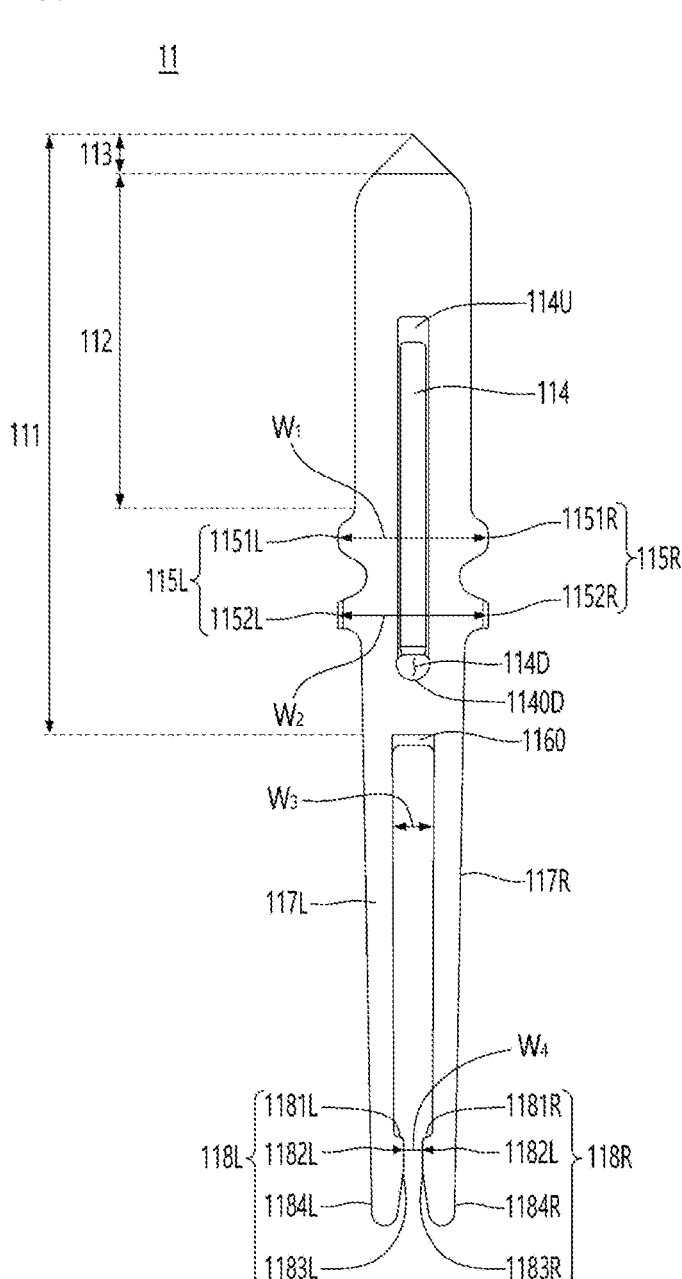
FIG. 2 is a front view of the contact pin of FIG. 1.
Figure 3:
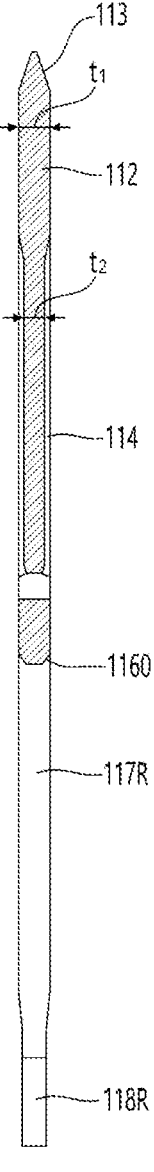
FIG. 3 a cross-sectional side view of the contact pin of FIG. 1.

FIG. 1 is an exploded view of a spring contact according to an embodiment of the present disclosure. FIG. 2 is a front view of the contact pin of FIG. 1. FIG. 3 is a cross-sectional side view of the contact pin of FIG. 1.

Embodiments will be described with reference to FIGS. 1 to 3 below.

A spring contact 10 according to the present embodiment includes a first contact pin 11, a second contact pin 13, and a spring 15. In the spring contact 10, the first contact pin 11 and the second contact pin 13 may be assembled to cross each other with respect to the spring 15 such that the first contact pin 11 and the second contact pin 13 are elastically supported by the spring 15.

The spring 15 of the present embodiment may have a thickness defined by an outer diameter d1 and an inner diameter d2, be a coil type compression spring of a certain length in a longitudinal direction of the spring contact 10, and be located between the first contact pin 11 and the second contact pin 13 of the spring contact 10, so that when the first contact pin 11 and the second contact pin 13 are compressed in the longitudinal direction, a restoring force may be applied to cause the contact pins 11 and 13 to return to original positions thereof with respect to the spring 15 before they are compressed.

The first contact pin 11 and the second contact pin 13 of the present embodiment may be contact pins having the same size and shape. The two contact pins 11 and 13 are assembled in the longitudinal direction to be elastically supported by the spring 15, and may be classified into the first contact pin 11 and the second contact pin 13 according to positions at which they are assembled. Therefore, embodiments will be described with respect to the first contact pin 11 below.

The first contact pin 11 may include a body part 111, a tip part 112, a contact part 113, a shoulder part 115, a guide part 114, and a leg part 118.

The body part 111 may form a certain width and a thickness t1, and include the tip part 112 and the contact part 113 that form an part of the spring contact 10 exposed outside the spring 15.

The contact part 113 is formed on one end of the body part 111, and is brought into contact with a circuit pattern of an printed circuit board installed for inspection in an inspection device or a contact ball or land of a BGA or LGA type integrated semiconductor circuit (IC) when a semiconductor device (IC) is tested through a test socket.

That is, when the semiconductor device (IC) is tested through a test socket to which the spring contact 10 of the present embodiment is applied, a contact part 133 of the second contact pin 13 is brought into contact with the contact ball or land of the BGA or LGA type semiconductor IC when the contact part 113 of the first contact pin 11 is in contact with the circuit pattern of the printed circuit board installed for inspection in the inspection device, thereby electrically connecting the printed circuit board for inspection and the semiconductor IC.

A tip end of the contact part 113 is pointed, and one or more contacts may be formed thereon as at least one of a width or a thickness t1 of the tip part 112 decreases at one end of the body part 111.

However, the above description is only an example, and the tip end of the contact part 113 may be formed to be round according to a feature of an object to be in contact therewith or be provided in a V shape, a U shape, a crown shape or the like to form contact points with a circuit pattern of a printed circuit board for inspection or a terminal ball/land of a BGA/LGA type semiconductor IC.

The shoulder part 115 may protrude in a width direction of the body part 111. The shoulder part 115 may include shoulder parts 115R and 115L that respectively protrude from right and left ends of the body part 111 in a vertical direction.

The shoulder parts 115R and 115L may be provided at positions symmetrical with respect to the body part 111. The shoulder part 115R protruding from one side of the body part 111 in a direction perpendicular to the body part 111 and the shoulder part 115L protruding from another side of the body part 111 in the direction perpendicular to the body part 111 are the same in terms of a degree of protrusion, a shape, a size, a thickness, a width, etc. and thus may be symmetrical to each other with respect to the body part 111. Therefore, embodiments will be described with reference to the shoulder 115R.

The shoulder part 115R may include a first shoulder 1151R and a second shoulder 1152R.

The first shoulder 1151R may be formed below the tip part 112 spaced a certain distance from the contact part 113 of the body part 111 in a longitudinal direction of the body part 111.

The first shoulder 1151R may assist in the alignment of the first contact pin 11 during the manufacture of the spring contact 10 of the present embodiment and/or a test socket, as will be described in more detail with reference to FIG. 8 below.

For the alignment of the first contact pin 11, the first shoulders 1151R and 1151L may respectively protrude from symmetric positions on both right and left ends of the body part 111 to form a width W1 greater than the width of the tip part 112.

The second shoulder 1152R may be formed at a position spaced a certain distance from the first shoulder 1151R in a direction away from the contact part 113. The second shoulder 1152R may support the elasticity of the spring 15 in the spring contact 10 of the present embodiment.

More specifically, the spring contact 10 may support the elasticity of the spring 15 through the second shoulders 1152R and 1152L of the first contact pin 11 and second shoulders 1352R and 1352L of the second contact pin 13.

In the above structure, the distance between an end of the second shoulder 1152R protruding from one side of the body part 112 and an end of the second shoulder 1152L protruding from the other side of the body part 111 may be defined as a width w2 between the second shoulders 1152R and 1152L, and the width w2 between the second shoulders 1152R and 1152L may be set to be greater than the inner diameter d2 of the spring to support both ends of the spring 15.

During the manufacture of a test socket, a diameter of a pin hole is preferably set to be small to reduce a pitch interval of the spring contact and thus the width w2 of the second shoulder may be in a range greater than the inner diameter d2 of the spring and less than the outer diameter d1 of the spring.

Meanwhile, the distance between an end of the first shoulder 1151R protruding from one side of the body part 111 and an end of the first shoulder 1151L protruding from the other side of the body part 111 may be defined as the width w1 of the first shoulders 1151R and 1151L.

The width w1 of the first shoulder may be equal to or greater than the width w2 of the second shoulder. A maximum width of a region of the body part 111 or a maximum width of a region of the tip part 112 may be determined on the basis of the width w1 of the first shoulder, as will be described in more detail with reference to FIG. 8 below.

The guide part 114 may be formed in a groove shape in the longitudinal direction of the body part 112. Accordingly, a thickness t2 formed by the guide part is set to be less than the thickness t1 of the body part.

When the second contact pin 13 is cross-coupled to the first contact pin 11, the guide part 114 may guide a movement of the second contact pin 13 in a vertical direction. A first stopping groove 114U may be formed on one end of the guide part 114 in a direction toward the contact part 113, and a second stopping groove 114D may be formed on another end of the guide part 114 in a direction toward the leg part 118.

When the spring contact 10 is compressed, a portion of a stopper member 138 of the second contact pin 13 may be inserted into the first stopping groove 114U. A portion of the stopping groove 138 of the second contact pin 13 may be inserted into the second stopping groove 114D to prevent the first contact pin 11 and the second contact pin 13 of the spring contact 10 from being separated due to the elasticity of the spring 15.

More specifically, as described above, the first contact pin 11 and the second contact pin 13 may be coupled to each other with the spring 15 interposed therebetween to cross each other, thereby forming the spring contact 10. In the above structure, during the compression of the spring contact 10, the stopper member 138 of the second contact pin 13 may be moved along the guide part 114 of the first contact pin 11 in the longitudinal direction of the body part 111 of the first contact pin 11.

The leg part 118 may extend in a direction opposite to the contact part 113 in the longitudinal direction of the body part 111. The leg part 118 may include a pair of leg parts 117R and 117L symmetrical to each other with respect to a center line of the body part 111. The pair of leg parts 117R and 117L may have a certain degree of elasticity so that a width w3 of the leg part increases when the spring contact 10 is compressed.

More specifically, the width w3 between the pair of leg parts 117R and 117L may be greater than the thickness t1 of the body part 111. In this structure, during the compression of the spring contact 10, the first contact pin 11 and the second contact pin 13 may be mutually moved by a certain distance to compress the spring 15.

A pair of stopper members 118R and 118L may be formed on ends of the pair of leg parts 117R and 117L.

A shortest distance w4 between the stopper member 118R on one leg part 117R and the stopper member 118L on the other leg part 117L may be set to be less than the thickness t1 of the body part 111, and preferably be greater than or equal to the thickness t2 of the guide part.

This is because surfaces 1182 and 1382 of the contact pins 11 and 13 that form the shortest distance w4 between the pair of stopper members 118R and 118L form electrical contact surfaces of the contact pins 11 and 13 in the spring contact pin 10. When the shortest distance w4 between the pair of stopper members is less than the thickness t2 of the guide part, the contact pins 11 and 13 of the spring contact pin 10 are likely to malfunction due to jamming.

Therefore, the shortest distance w4 between the pair of stopper members may be set to be equal to or greater than the thickness t2 of the guide part so that in the spring contact pin 10, four electrical contact surfaces may be formed through the contact surfaces 1182 and 1382 of the contact pins 11 and 13 and at least one of contact surfaces 1182R and 1182L of one contact pin, e.g., the contact pin 11, may be in electrical contact with a bottom surface of a guide part 134 of the other contact pin 13.

Meanwhile, for the assembly of the first contact pin 11 and the second contact pin 13, flanges 1181R and 1181L of the stopper member of the first contact pin 11 may be assembled with a flange of the second stopping groove 114D of the guide part of the second contact pin 13, and flanges 1381R and 1381L of the stopper member of the second contact pin 13 may be assembled with a flange of the stopping groove 134D of the guide part of the first contact pin 11.

In the above structure, the width w3 between the pair of leg parts 117R and 117L may be changed by an elastic force during the assembly of the spring contact 10 and/or the compression of the spring contact 10.

In particular, for the assembly of the spring contact 10, an inclined surface 1160 may be provided on a portion of the body part 111 from which the pair of leg parts 117R and 117L extend, so that the second contact pin 13 may be easily assembled to cross the first contact pin 11 to cause a leg part 137 of the second contact pin 13 or the stopper member 138 to be seated on the guide part 114 of the first contact pin 11.

The first contact pin 11 and the second contact pin 13 are assembled inside the spring 15 such that the flanges 1381R and 1381L of the stopper member of the second contact pin 13 may be caught by a flange 1140D of the second stopping groove 114D of the first contact pin 11.

Contact surfaces 1382R and 1382L of the stopper member of the second contact pin 13 are vertically movable along the guide part 114 to be in electrical contact with a bottom surface of the guide part 114 of the first contact pin 11, and thus, the first contact pin 11 and the second contact pin 13 may be mutually moved by a certain distance while compressing the spring 15.

That is, before the compression of the spring contact 10, the flanges 1381R and 1381L of the second contact pin 13 may be kept caught by the flange 1140D of the second stopping groove 114D of the first contact pin 11, and prevent the separation of the first contact pin 11 and the second contact pin 13 due to the elasticity of the spring 15.

For the compression of the spring contact 10, the first contact pin 11 and the second contact pin 13 may be moved along the guide part 114 to compress the spring contact 10 while the contact surfaces 1382R and 1382L of the second contact pin 13 are in electrical contact with the bottom surface of the guide part 114 of the first contact pin 11.

When the spring contact 10 is compressed, the flanges 1381R and 1381L of the second contact pin 13 may be kept caught by a flange (not shown) of the first stopping groove 114U of the first contact pin 11, and prevent the electrical contact between the first contact pin 11 and the second contact pin 13 from being released due to the elasticity of the spring 15.

The relationship between the guide part 114 and the stopping grooves 114U and 114D of the first contact pin 11 with respect to the stopper member 138 of the second contact pin 13 has been described in the above-described embodiment in which the spring contact 10 is compressed but may also applied to a relationship between the guide part 134 and stopping grooves 134U and 134D of the second contact pin 13 with respect to a stopper member 118 of the first contact pin 11.

Meanwhile, in order to implement the above-described structure, the stopper member 118 of the present embodiment may include a flange 1181, a contact surface 1182, an inclined surface 1183, and an outer surface 1184.

More specifically, a space corresponding to the shortest distance w4 between the pair of stopper members described above may be located between the contact surfaces 1182R and 1182L of the pair of stopper members.

Therefore, the first contact pin 11 and the second contact pin 13 are electrically connected to each other, when the contact surface 1182 of the first contact pin 11 is in electrical contact with the bottom surface of the guide part 134 of the second contact pin 13 and the contact surface 1382 of the second contact pin 13 is in electrical contact with the bottom surface of the guide part 114 of the first contact pin 11.

The spring contact 10 may be assembled, when flanges 1181 and 1381 of the contact pins are caught by flanges 1140D and 1340D of the second stopping grooves 114D and 134D of the contact pins to which the flanges 1181 and 1381 of the contact pins are cross-coupled while the spring 15 is slightly compressed compared to an initial length thereof.

A tip part of the stopper member may be inserted into the stopping grooves 114U and 114D of the guide part as described above.

Meanwhile, the inclined surface 1183 may be inclined at a certain slope from the contact surface 1182 toward an end of the stopping member, and the end of the stopping member may be formed as a curved surface with a certain curvature by the inclined surface 1183 and the outer surface 1184.

In this structure, during the assembly of the spring contact 10, when the second contact pin 13 is cross-assembled with the first contact pin 11, an end of the stopper member may be easily seated on the guide part 114 along the inclined surface 1160 at a point at which the body part 111 and the leg part 117 are connected.

Figure 4:
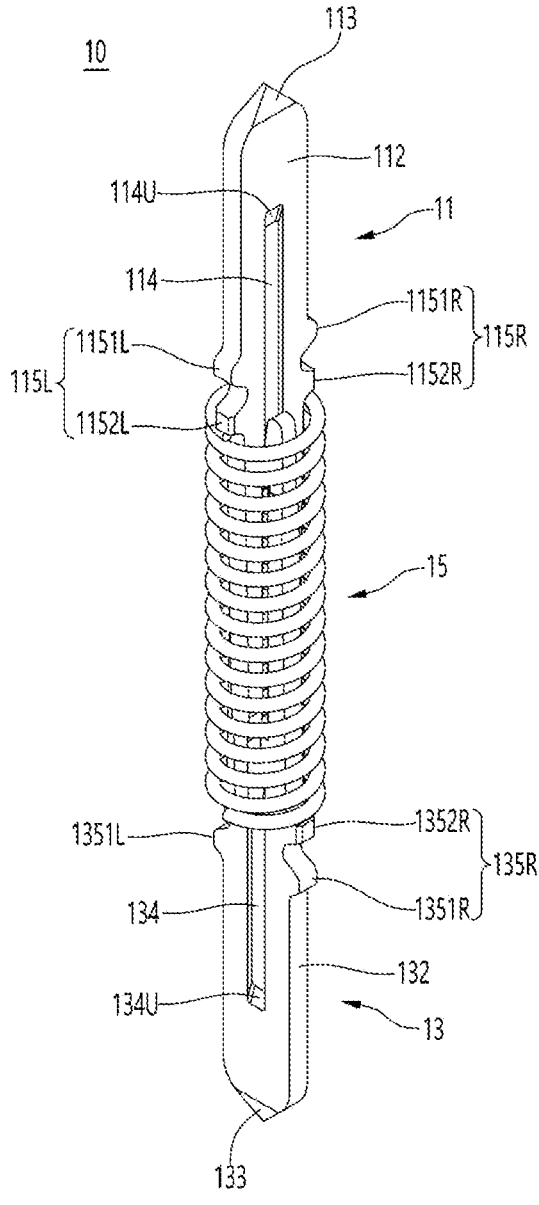
FIG. 4 is a perspective view of a spring contact according to an embodiment of the present disclosure.
Figure 5:
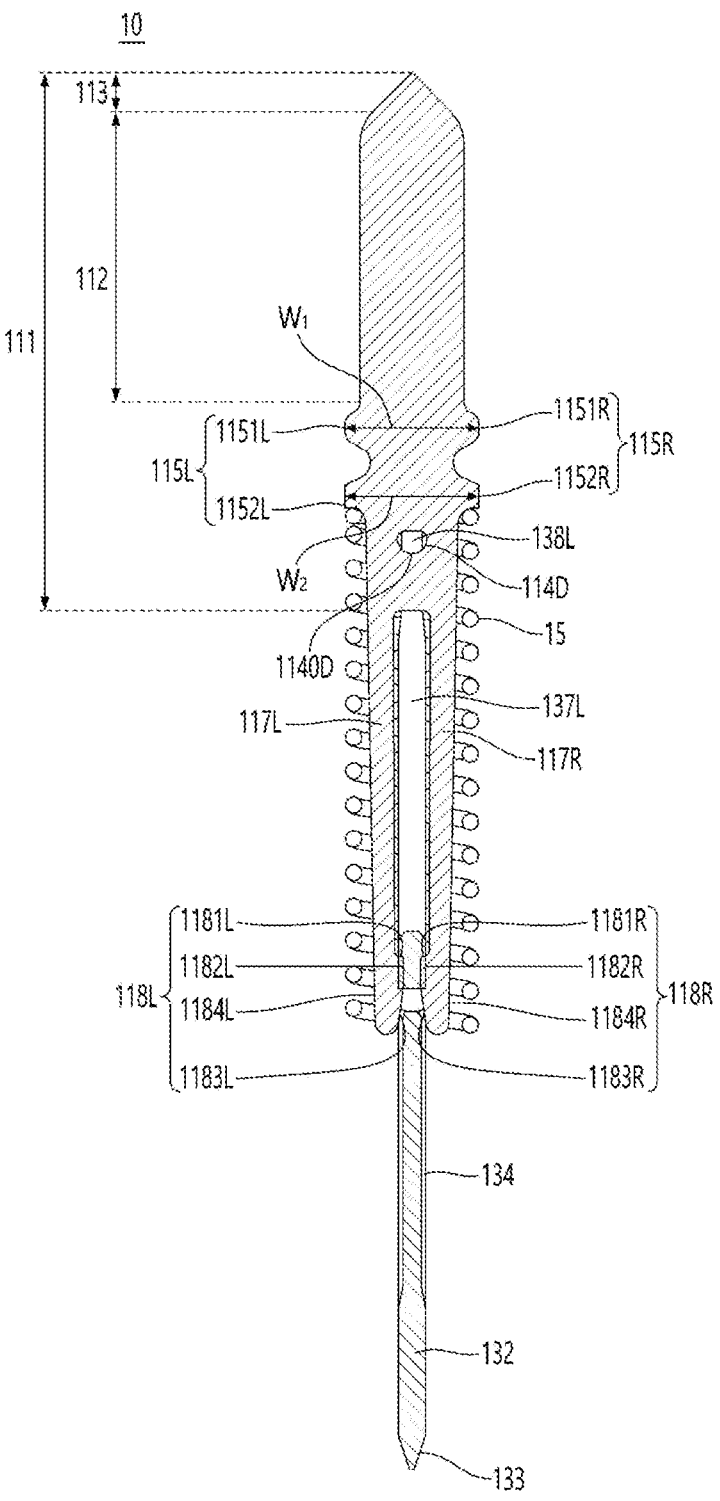
FIG. 5 is a cross-sectional view of the spring contact of FIG. 4.
Figure 6:
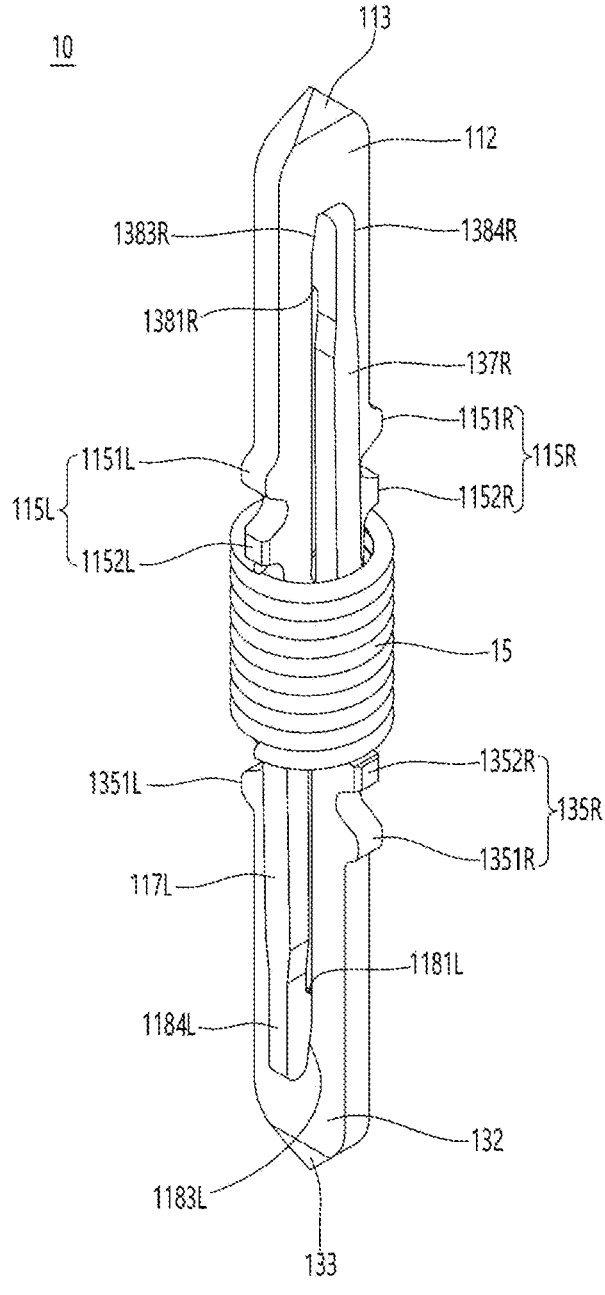
FIG. 6 is a perspective view of a state in which the spring contact of FIG. 4 is compressed.
Figure 7:
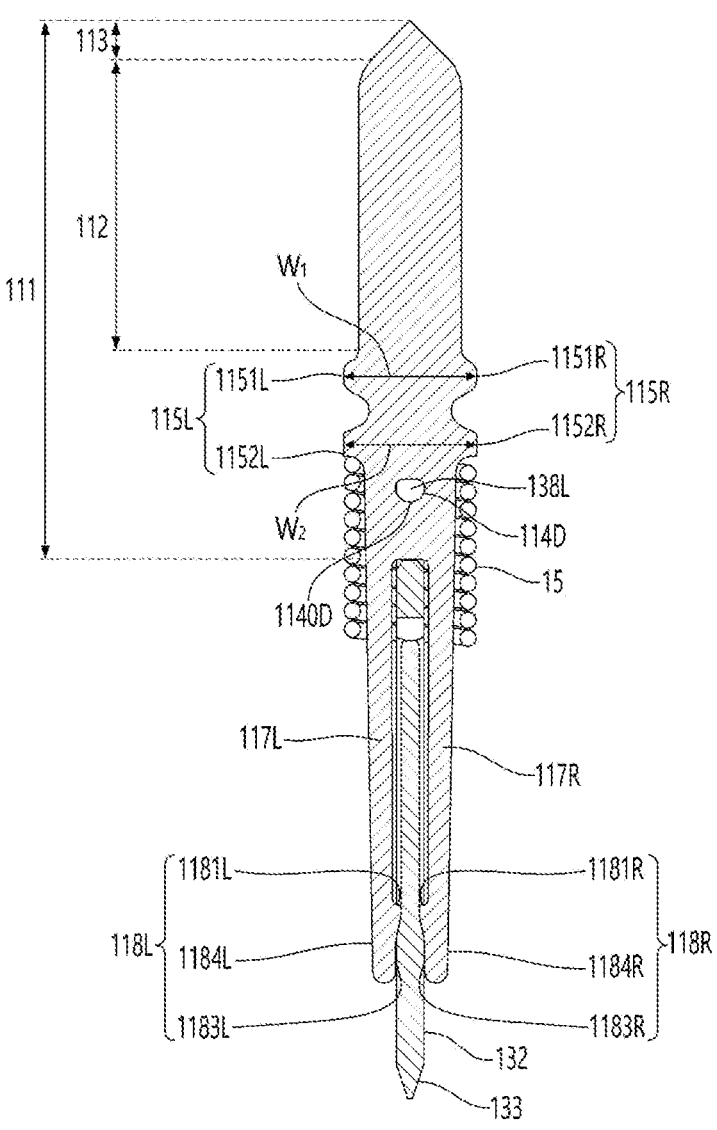
FIG. 7 is a cross-sectional view of the spring contact of FIG. 6.

FIG. 4 is a perspective view of a spring contact according to an embodiment of the present disclosure. FIG. 5 is a cross-sectional view of the spring contact of FIG. 4. FIG. 6 is a perspective view of a state in which the spring contact of FIG. 4 is compressed. FIG. 7 is a cross-sectional view of the spring contact of FIG. 6.

Embodiments will be described with reference to FIGS. 4 to 7 below, and a description of parts that are the same as those described above with reference to FIGS. 1 to 3 is omitted.

FIGS. 4 and 5 are diagrams illustrating a state (hereinafter referred to as a first state) in which a spring contact 10 has yet to be compressed after a first contact pin 11, a second contact pin 13, and a spring 15 are assembled together. FIGS. 6 and 7 are diagrams illustrating a state (hereinafter referred to as a second state) in which the spring contact 10 is compressed.

In the first state, second shoulders 1152 and 1352 are in contact with both ends of a spring 15, and support the elasticity of the spring 15. In addition, a stopper member 118 of a first contact pin 11 is inserted into a second stopping groove 134D of a second contact pin 13 to assemble the first contact pin 11 and the second contact pin 13 while the spring 15 is compressed to a small degree.

More specifically, the stopper member 118 of the first contact pin 11 inserted into the second stopping groove 134D will be described as an example. In the first state, a flange 1181 is kept assembled in contact with a step (flange 1340D) formed by the second stopping groove 134D, so that the first contact pin 11 and the second contact pin 13 may be assembled while supporting the elasticity of the spring 15.

Meanwhile, in the second state, the flange 1181 may be maintained in contact with a step formed by a first stopping groove 134U, thereby improving electrical contact performance during the compression of the spring contact 10.

The flange 1181 may form a certain inclined surface with a contact surface 1182 or an edge line connecting the flange 1181 and the contact surface 1182 may be curved.

Thus, in the above structure, when in the second state, the flange 1181 is brought into contact with the first stopping groove 134U, the contact surface 1182 becomes in contact with a bottom surface of the stopping groove 134U, so that a contact area between the first contact pin 11 and the second contact pin 13 may be increased to improve electrical contact performance of the spring contact 10. At the same time, when the flange 1181 forms a certain inclined surface toward the contact surface 1182 or the edge line connecting the flange 1181 and the contact surface 1182 is curved, it is possible to easily switch from the second state to the first state.

Figure 8:
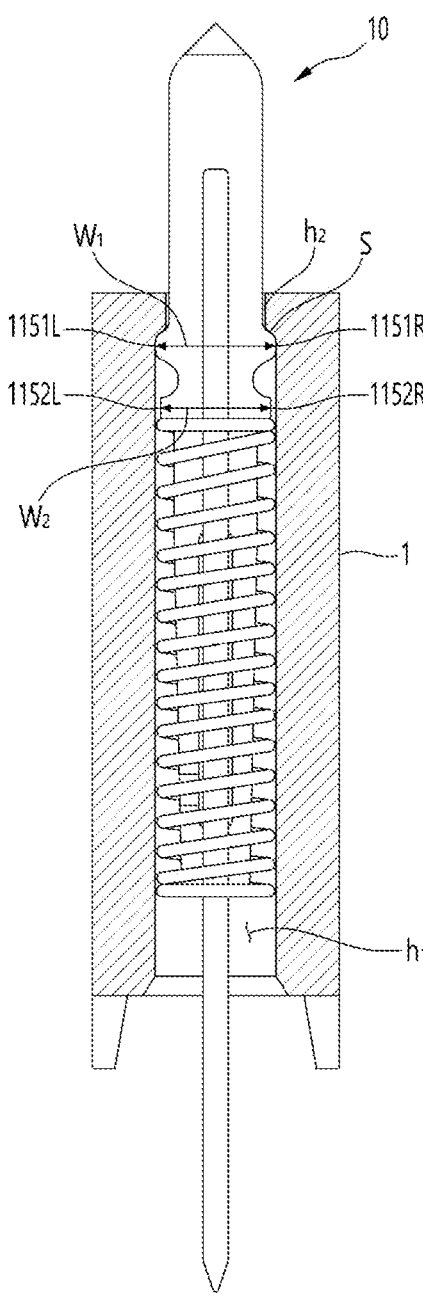
FIG. 8 is a cross-sectional view of a state in which a spring contact is inserted into a pin hole according to an embodiment of the present disclosure.

FIG. 8 is a cross-sectional view of a state in which a spring contact is inserted into a pin hole according to an embodiment of the present disclosure.

Embodiments will be described with reference to FIG. 8, and a description of parts that are the same as those described above with reference to FIGS. 1 to 7 is omitted.

In a test socket, spring contacts are installed in a housing 1 according to a certain rule. More specifically, pin holes are formed in the housing 1 and the spring contacts are inserted into the pin holes.

The pin holes of the present embodiment have different diameters to form a type of step hole.

More specifically, a series of processes of processing a pin hole of the present embodiment will be described below. First, a first hole h1 with a first diameter is formed in the housing 1. In addition, a second hole h2 with a second diameter may be formed in the first hole h1. Here, the first diameter may be larger than the second diameter and thus a step hole may be formed by the first hole h1 and the second hole h2.

As described above, the second hole h2 with a small diameter may be formed after the hole h1 with a relatively large diameter is formed, thereby increasing the efficiency of hole processing. For example, a width w1 of a first shoulder may be 0.58 pi, and a width of a body part may be 0.45 pi. As a diameter of a pin hole decreases, costs and time for processing the pin hole increase, and the accuracy of processing the pin hole decreases. In addition, as the length of a spring contact increases according to a customer's demand as shown in FIGS. 9 to 12, the thickness of the housing 1 increases, thus making it more difficult to process a pin hole with a small diameter.

Accordingly, in the present embodiment, the second hole h2 is formed in a remaining thickness of the housing 1 after the first hole h1 with a relatively large diameter is formed to form a diameter (step hole) for accommodation of a tip part 112 and a contact part 113, thereby facilitating the processing of a pin hole for accommodation of spring contacts of various lengths.

Due to the above structure, a diameter formed by the first hole h1 may correspond to the width w1 of the first shoulder.

Figure 9:
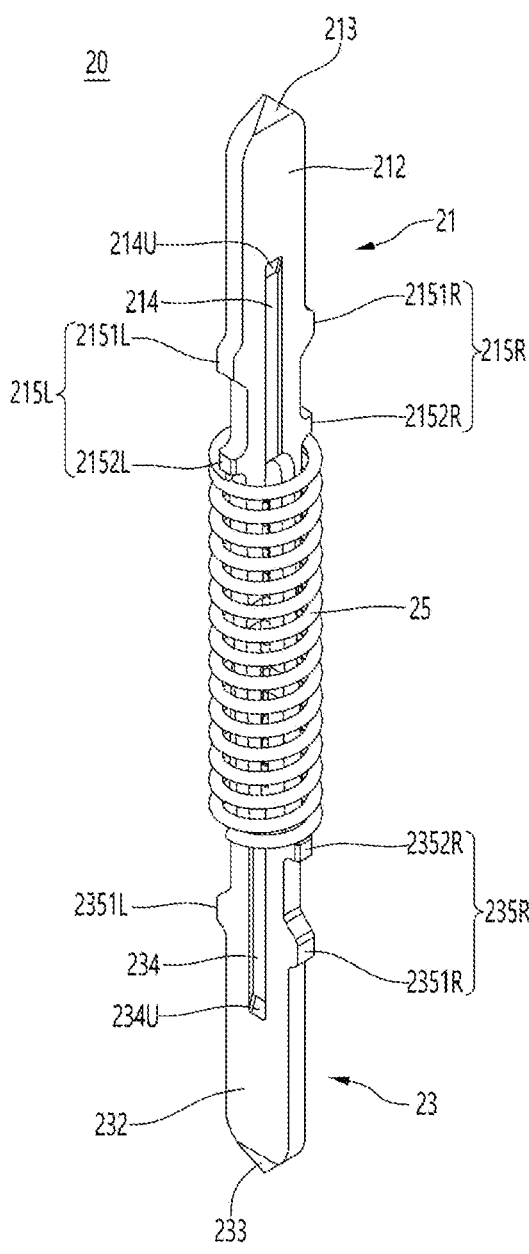
FIGS. 9 to 12 illustrate spring contacts of various lengths according to embodiments of the present disclosure.
Figure 10:
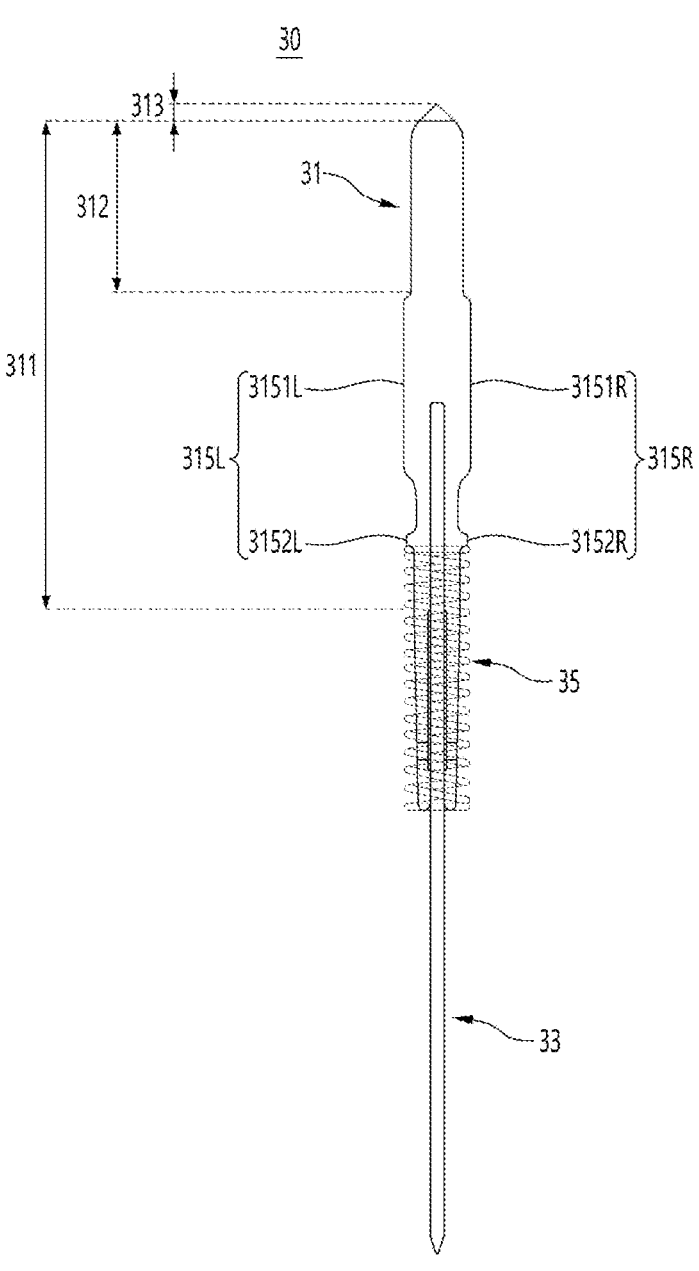
Figure 11:
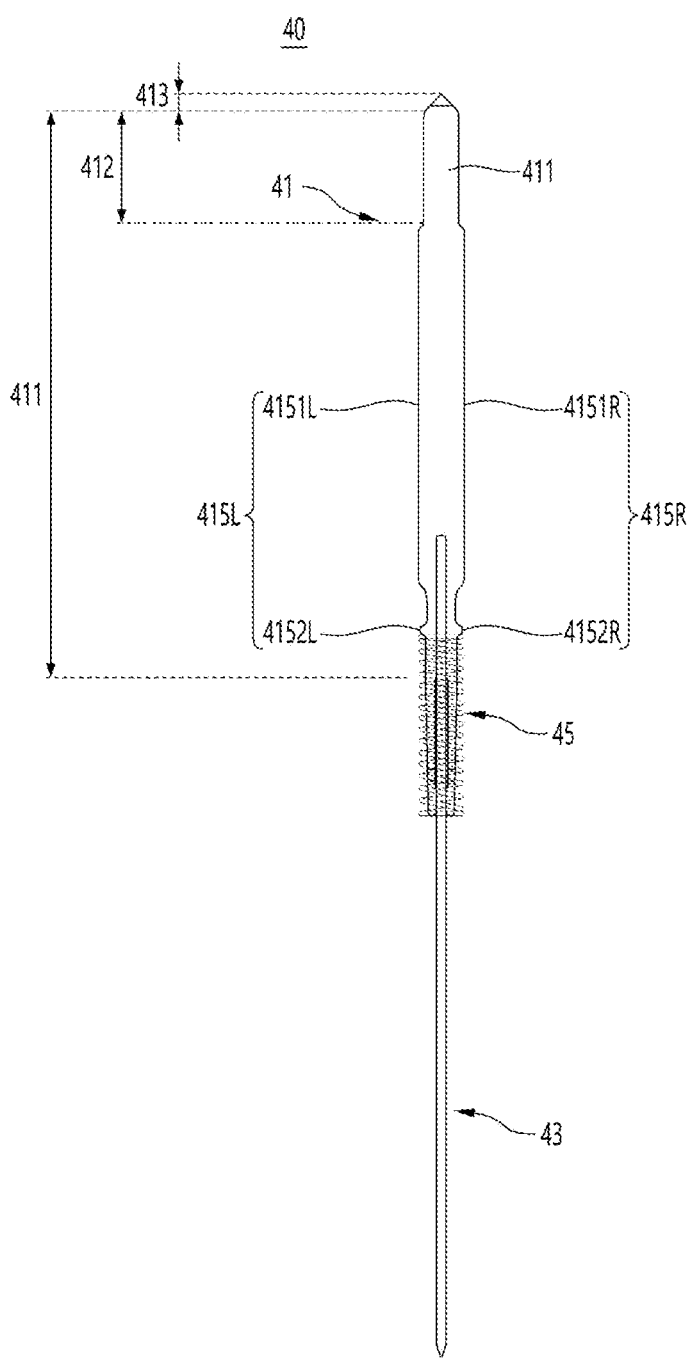
Figure 12:
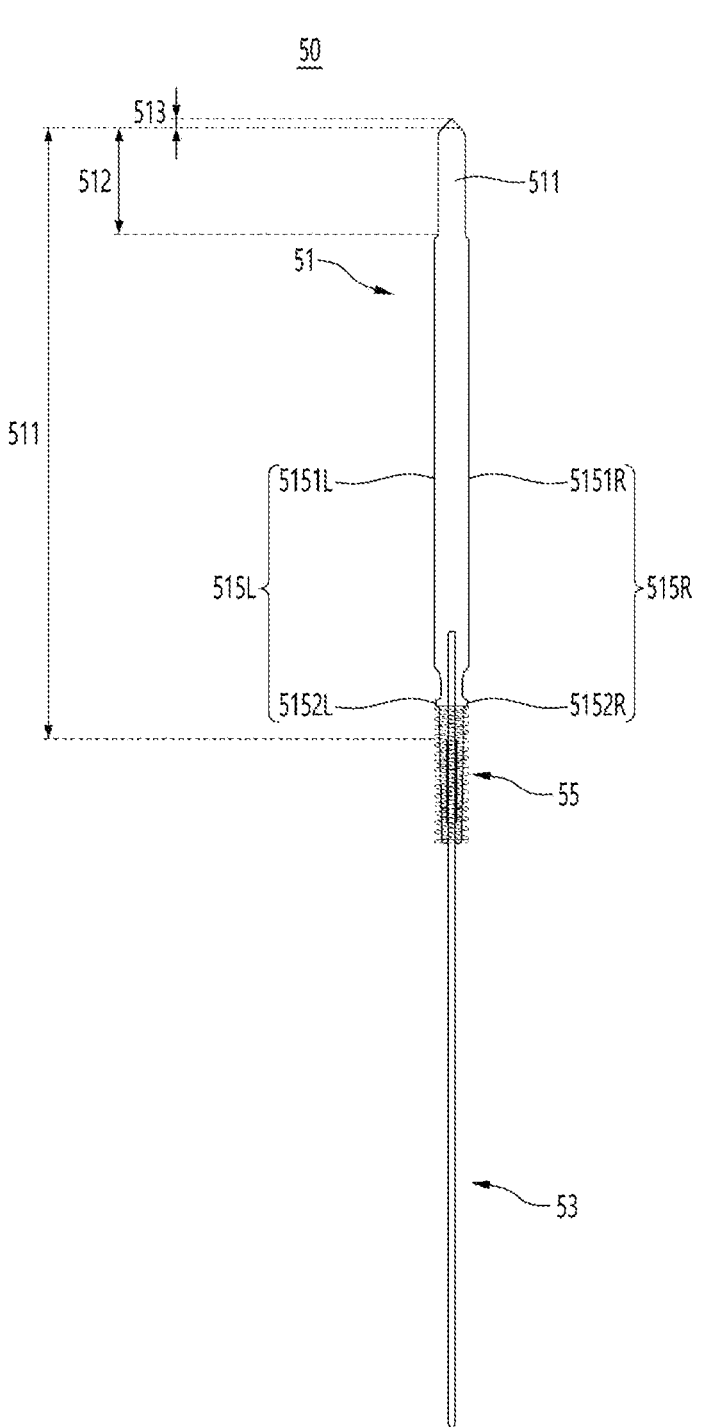

FIGS. 9 to 12 illustrate spring contacts of various lengths according to embodiments of the present disclosure. More specifically, FIG. 9 illustrates a 6.7 mm spring contact 20, FIG. 10 illustrates a 10 mm spring contact 30, FIG. 11 illustrates a 16 mm spring contact 40, and FIG. 12 illustrates a 22 mm spring contact 50.

In a structure of a conventional pogo type spring contact, as the length of the spring contact increases, a thickness of a socket housing for accommodation of the spring contact increases, thus making it more difficult to form a pin hole, for accommodation of the spring contact, in the socket housing.

In order to solve the above problem, the present embodiment provides a contact pin with first shoulders 1151 and 1351 that assist an alignment of the contact pin during the manufacture of a spring contact.

When as in the conventional spring contact, a contact pin is aligned inside a pin hole through a protrusion member (the second shoulders 1152 and 1352 in the present embodiment) for supporting the elasticity of a spring without the first shoulders 1151 and 1351, a hole with a small diameter for accommodation of a tip part of a contact pin should be processed to be deeper as a pin hole for accommodation of a spring contact, as the length of the spring contact increases. Thus, it is difficult to process the hole with the small diameter, and guarantee the strength of the contact pin as a body part of the contact pin increases, thus resulting in a decrease in the quality of a product.

Even when the length of a spring is relatively increased to prevent an increase in the length of the tip part of the contact pin, it is obvious that there are structural limitations when the elasticity of the spring is considered, and an elastic restoring force may decrease as the length of the spring increases.

Therefore, as shown in FIGS. 9 to 12, when spring contacts are formed in different lengths, the above problem can be fixed by setting the distance between a first shoulder 2151 and a second shoulder 2152 to be longer than the spring contacts of FIGS. 1 to 7 as shown in FIG. 9 or increasing the lengths of first shoulders 3151, 4151, and 5151 in longitudinal direction of the body part as shown in FIGS. 10 to 12. In addition, in the various embodiments described above, the first contact pin and a second contact pin may be formed in different lengths according to customers' demand.

Figure 13:
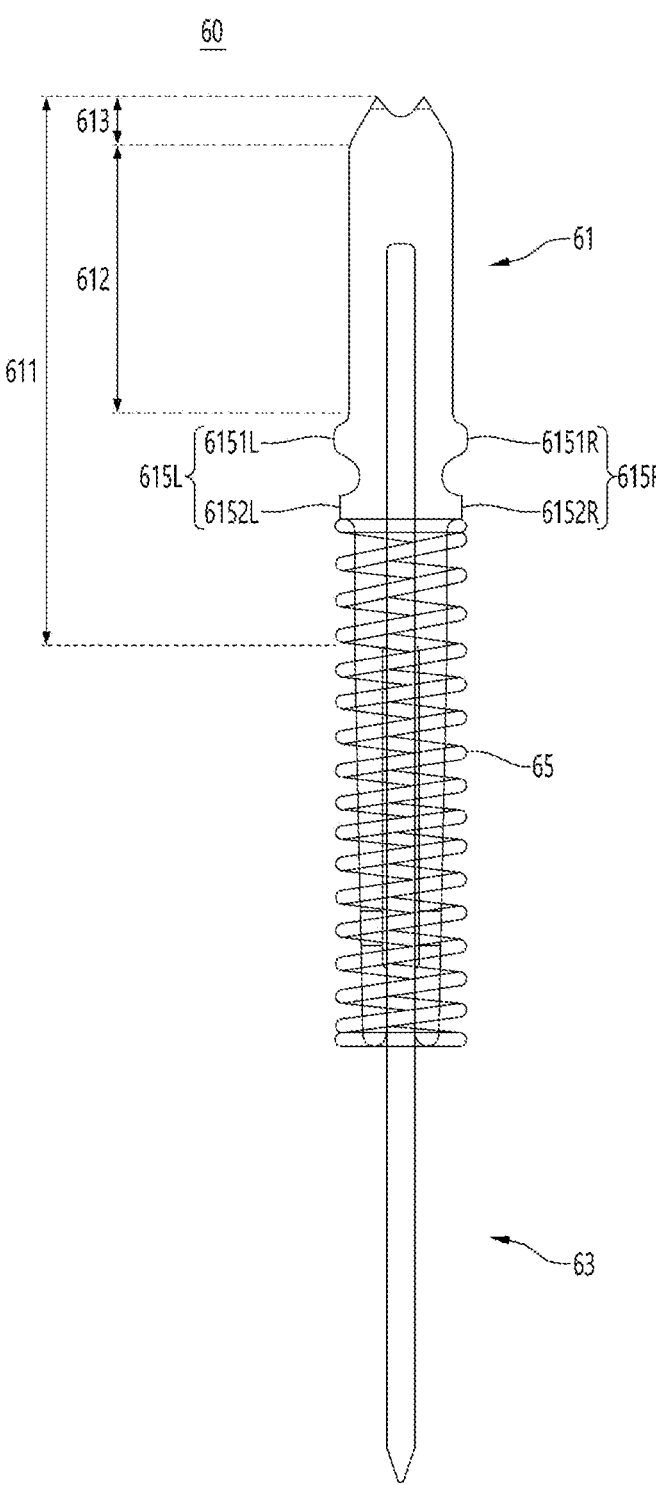
FIGS. 13 to 15 illustrate spring contacts with various types of contact parts according to embodiments of the present disclosure.

FIG. 13 illustrates a spring contact with various types of contact parts according to an embodiment of the present disclosure.

As shown in FIG. 13, an end of a contact part 613 may be provided with multiple edge lines to form multiple contacts with an object to be inspected. In this case, an end of a tip part 613 of a first contact pin 61 and an end of a tip part of a second contact pin 63 may be different in shape.

Figure 14:
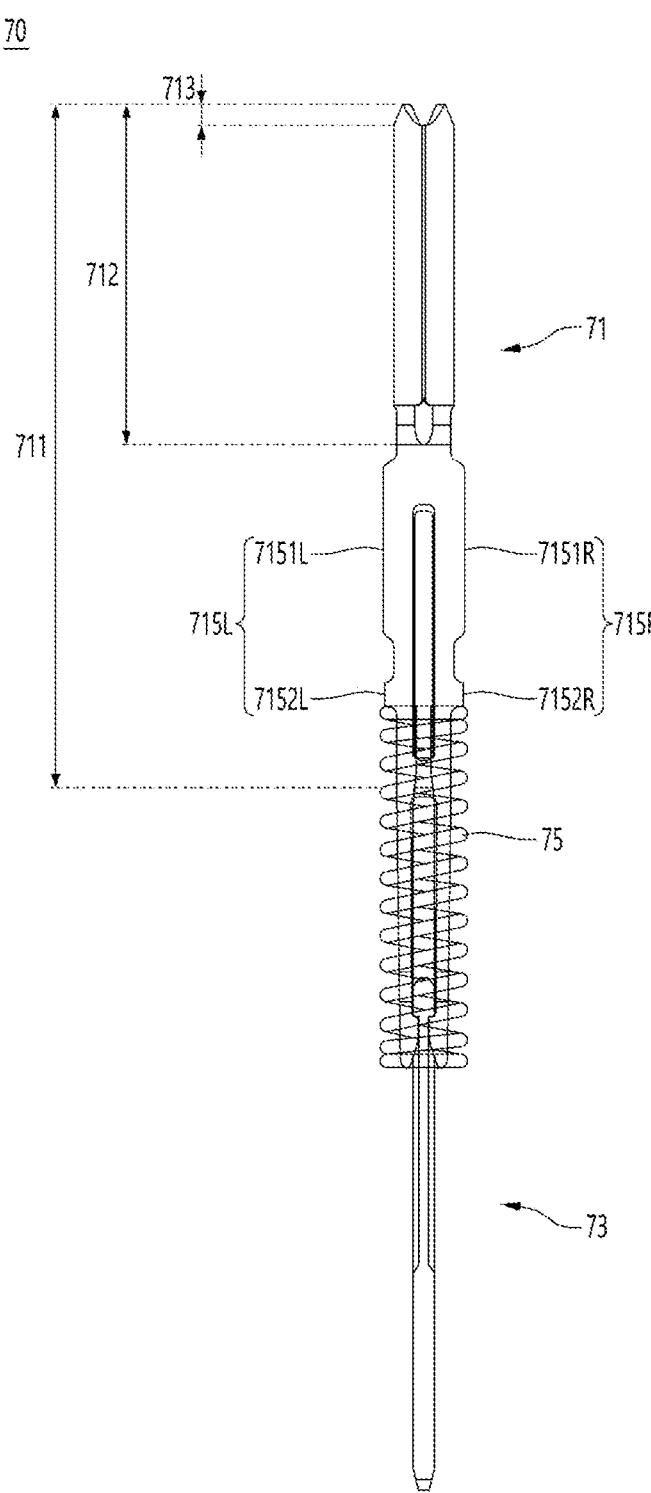
Figure 15:
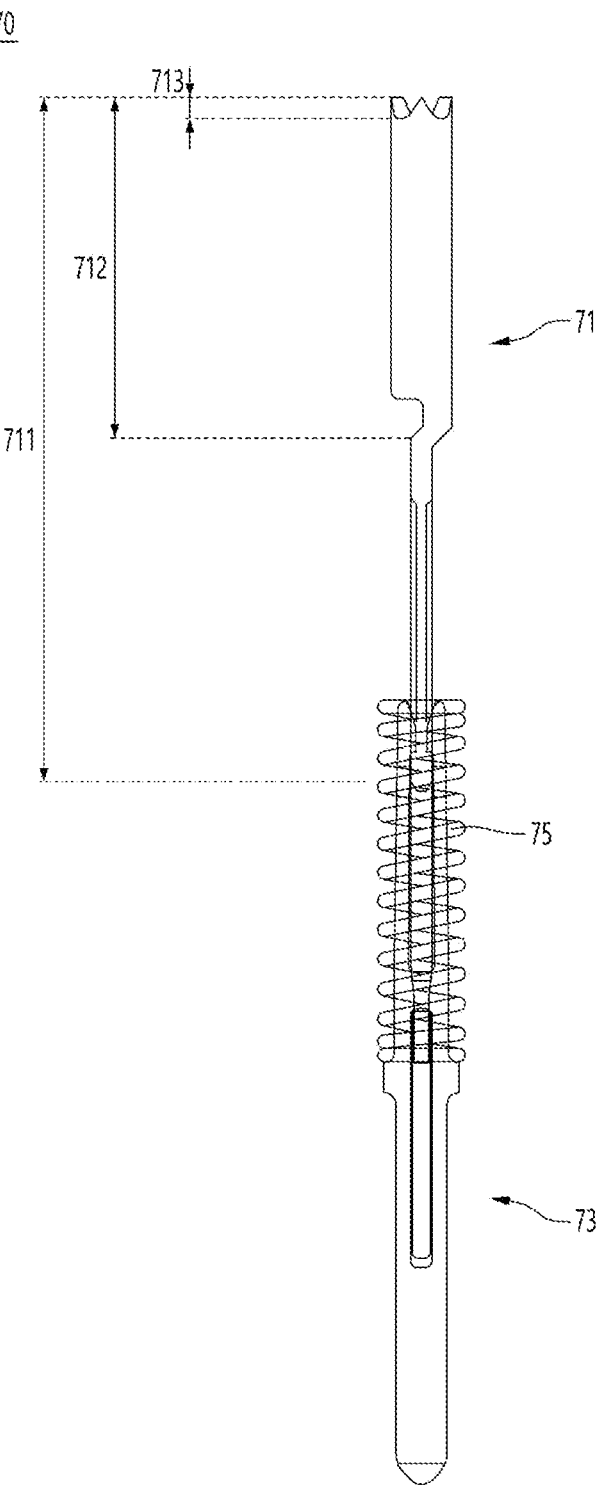

FIGS. 14 and 15 illustrate examples of a spring contact with a contact pin that includes a crown-shaped contact part as a portion of a body part of the contact pin is rolled.

In the present embodiment, in a spring contact 70, a contact part of a first contact pin 71 and a contact part of a second contact pin 73 may be in different shapes.

More specifically, a portion of a body part 711 of the first contact pin 71 may be rolled in a width direction of the body part 711. In the present embodiment, the portion of the body part 711 may be understood to mean a portion of an interface between a contact part 713 and a shoulder part 715R and 715L. For example, as in the present embodiment, a tip part 712 may be formed by rolling a stamped plate in the width direction.

In this structure, a cross section of the contact part 713 in the width direction may be circular. In addition, the contact part 713 may be in the form of crown with multiple edge lines along an end of the tip part 712.

According to various embodiments of the present disclosure, the quality of a test socket can be improved when a spring contact is manufactured in various lengths according to customers' demand.

When a spring contact is manufactured in various lengths according to customers' demand for performance, a defect rate of test sockets can be reduced to improve the yield of products.

To manufacture the spring contact in various lengths according to customers' demand for performance, when a body part is formed in various lengths, a first shoulder may be manufactured in proportion to the length of the body part and thus a tip part need not be manufactured to be longer than necessary. Therefore, it is possible to reduce a production time and costs by manufacturing spring contacts of various lengths in a series so that the length of a body part may be proportional to that of a first shoulder.

In addition, a width of a tip part can be set to be less than that of the first shoulder, the tip part can be maintained at an appropriate length even when a spring contact is long, and the first shoulder can be extended in a longitudinal direction of the body part, so that during the manufacture of a test socket, a hole for accommodation of a width of a tip part of a spring contact pin may be processed to an appropriate depth and a hole with a diameter for accommodation of the first shoulder may be processed to be deep to correspond to the length of the first shoulder (processing of a step hole), thereby facilitating the processing of a pin hole.

The pin hole can be easily processed to have a diameter for accommodation of the width of the tip part of the spring contact pin.

Furthermore, the strength of the spring contact pin can be guaranteed to improve quality.

Effects of the present disclosure are not limited to those described above, and other effects not described here may be clearly understood by those skilled in the art from the following description.

Although various embodiments of the present disclosure have been disclosed for illustrative purposes, those skilled in the art will appreciate that various modifications, additions and substitutions are possible, without departing from the scope and spirit of the present disclosure as disclosed in the accompanying claims. Accordingly, the scope of the present disclosure is not construed as being limited to the described embodiments but is defined by the appended claims as well as equivalents thereto.

What is claimed is:

1. A contact pin for a spring contact, comprising:
   a body part forming a predetermined width and thickness;
   a contact part provided on one end of the body part to be in contact with an object to be inspected;
   a shoulder part protruding in a width direction of the body part;
   a leg part extending in a longitudinal direction of the body part to face the contact part; and
   a guide part formed in the longitudinal direction of the body part to guide a vertical movement of another contact pin when coupled to the other contact pin,
   wherein the shoulder part comprises:
      first shoulders configured to assist an alignment of the contact pin during manufacture of the spring contact; and
      second shoulders configured to support elasticity of a spring, the second shoulders being independently provided from the first shoulders at positions spaced a certain distance therefrom and away from the contact part;
   wherein the first shoulders are provided at positions spaced a certain distance from the contact part in the longitudinal direction of the body part, and both the first shoulders and the second shoulders protrude from symmetrical positions on both ends of the body part,
   wherein a width of the first shoulders is greater than or equal to a width of the second shoulders,
   wherein the leg part comprises a pair of symmetric leg parts, and a pair of stopper members protruding from opposite ends of the leg part,
   wherein the guide part comprises a stopping groove into which a stopper member of another contact pin is inserted when the spring contact is compressed,
   wherein the stopper member comprises:
      a first surface in surface contact with a step of the stopping groove; and
      a second surface inclined at a certain slope on one end of the first surface toward an end of the stopper member, and
   wherein the second surface is inclined at the slope in a direction in which a width of the stopper member decreases.

2. The contact pin of claim 1, wherein a width of the second shoulders is less than an outer diameter of the spring.

3. The contact pin of claim 1, wherein the contact part is formed on one end of the body part to decrease at least one of the width or thickness of the body part.

4. The contact pin of claim 1, wherein a shortest distance between the pair of stopper members is less than the thickness of the body part.

5. The contact pin of claim 1, wherein a shortest distance between the pair of stopper members is greater than or equal to a thickness of the guide part.

6. The contact pin of claim 1, wherein the stopping groove is formed in one end of the guide part.

7. A spring contact comprising the contact pin of claim 1 as a pair of first and second contact pins, the spring contact comprising a spring supported by a shoulder part of the first contact pin and a shoulder part of the second contact pin.

8. The spring contact of claim 7, wherein a leg part of the first contact pin and a leg part of the second contact pin cross each other in a vertical direction.

9. The spring contact of claim 8, wherein the first contact pin and the second contact pin are the same in length.

10. The spring contact of claim 8, wherein the first contact pin and the second contact pin are different from each other in length.

11. The spring contact of claim 8, wherein a contact part of the first contact pin and a contact part of the second contact pin are different from each other in shape.

12. The spring contact of claim 11, wherein at least one of the contact part of the first contact pin or the contact part of the second contact pin forms two or more contacts with an object to be inspected.

\* \* \* \* \*